Sept. 13, 1966 H. L. KENNEDY 3,273,075

PULSE GENERATOR SYSTEM PROVIDING PULSE SUPERIMPOSED ON PEDESTAL

Filed Aug. 19, 1963

INVENTOR.
Howard L. Kennedy
BY Mueller & Aichele
Attys.

United States Patent Office 3,273,075

Patented Sept. 13, 1966

3,273,075

PULSE GENERATOR SYSTEM PROVIDING PULSE SUPERIMPOSED ON PEDESTAL

Howard L. Kennedy, Phoenix, Ariz., assignor to Motorola Inc., Chicago, Ill., a corporation of Illinois Filed Aug. 19, 1963, Ser. No. 303,003

5 Claims. (Cl. 331—87)

This invention relates generally to a system for providing pulses for actuating a magnetron oscillator, and more particularly to a system for providing a pulse pedestal for conditioning a magnetron oscillator prior to the application of the high power firing pulse.

Various pulse circuits have been used for firing magnetron oscillators or the like, but these have not been entirely satisfactory particularly when very short duration pulsing of the magnetron oscillator is desired. The application of a firing pulse having a steep voltage rise to provide short pulses may cause oscillations of the magnetron at an undesired mode of operation. On the other hand, the use of a pulse with a slow rise may result in a pulse having a greater width than desired.

It is therefore an object of the present invention to provide an improved circuit for providing pulses for actuating a magnetron oscillator.

A further object is to provide a pulse circuit which conditions the magnetron for the desired mode of operation and which then actuates the magnetron for the desired period, which may be very short.

A feature of the invention is the provision of a pulse generating circuit for actuating a magnetron including a first portion for providing a pedestal for preconditioning the magnetron, followed by a fast rising high power firing pulse.

Another feature of the invention is the provision of a capacitor discharge circuit for providing a pedestal having a slow rising voltage, with a pulse forming network coupled through a saturable reactor for providing a delayed fast rising high power pulse on the pedestal. The capacitor circuit may include a first capacitor which discharges rapidly, and a second capacitor arranged to discharge more slowly to provide the desired pulse shape.

The invention is illustrated in the drawing wherein.

In accordance with the invention a pulse circuit for firing a magnetron is provided including a pulse forming network for applying a pulse to the magnetron coupling transformer. The pulse forming circuit is connected in series with a saturable reactor to a charging circuit for storing energy therein. Coupled in parallel to the pulse forming network and saturable reactor is a circuit including at least one capacitor and one resistor connected in series. This capacitor is also charged from the charging circuit. A modulator switch is provided which may be a PNPN type transistor for grounding the charging circuit so that the capacitor and the pulse forming network discharge to provide a firing pulse for the magnetron. Because of the initial high impedance of the saturable reactor, the pulse forming circuit does not immediately discharge. Therefore, the capacitor discharges first to provide a pedestal having a slow rising voltage which conditions the magnetron for oscillation at the desired mode. A second capacitor in series with a second resistor may be used which discharges more slowly to provide the desired pedestal shape. The saturable reactor saturates while the capacitor (or capacitors) discharges so that the impedance thereof is greatly reduced, allowing the pulse firing network to discharge. This provides a fast rising high power firing pulse superimposed on the pedestal. The high power firing pulse width is determined by the pulse forming network design, and unless terminated by some other means the width is twice the one way time delay of the network. Following the pulse, the switch is opened to allow the capacitors and network to be recharged. The recharge current through the saturable reactor resets the core thereof by saturating it in the opposite direction.

Figure 1:
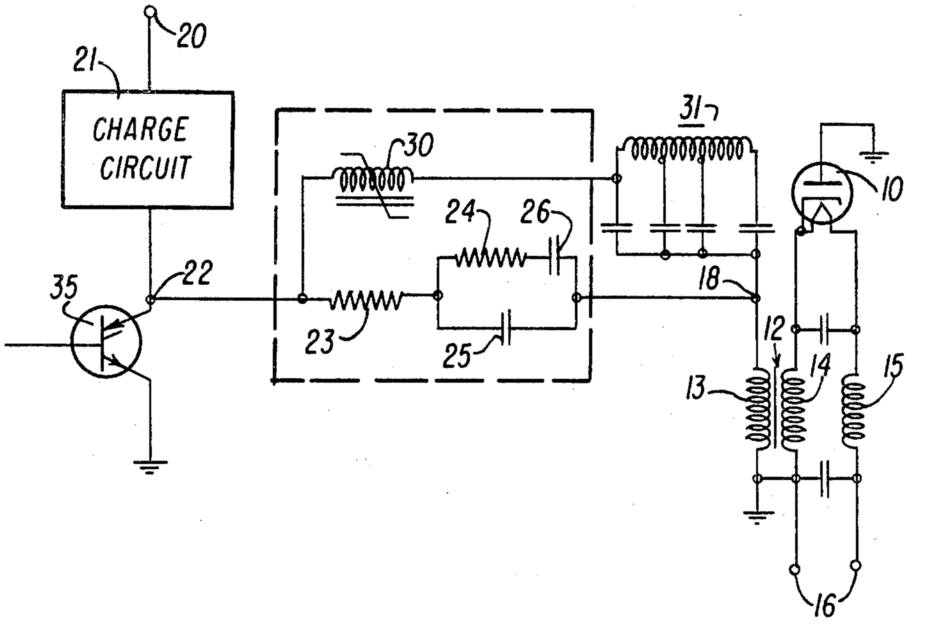
FIG. 1 is a circuit diagram of the pulse circuit of the invention.

Referring now to the drawing, in FIG. 1 there is shown the schematic diagram of the pulsing circuit of the invention. The magnetron tube is shown at 10 with transformer 12 being provided for applying pulses thereto. Heater current is applied at terminals 16 through windings 14 and 15, which together with primary winding 13 form the transformer 12. Voltage applied from terminal 20 energizes charging circuit 21 which provides a potential at point 22. The charging circuit may be of any known construction providing a direct current potential, including means preventing shorting of the source when the terminal 22 is grounded, and means for supplying sufficient recharge current to reset the core of saturable reactor 30, as will be described.

The potential at point 22 is applied through the circuit including resistors 23 and 24 and capacitors 25 and 26, and extending from terminal 18 through primary winding 13 to ground. Capacitors 25 and 26 will charge from the voltage at terminal 22. Also connected to terminal 22 is saturable reactor 30 and pulse forming network 31. The pulse forming network may be of any standard configuration, and the configuration shown in the drawing is representative. The pulse forming network 31 will also charge to store energy therein, drawing current through the coil of saturable reactor 30 to saturate the core thereof in one direction.

A switch is provided to ground the terminal 22, being illustrated at 35 in the drawing as a NPNP type transistor. It is obvious that a thyratron or other switching device can be used in this application, the only requirement being to provide a low impedance between point 22 and ground, and to operate at the required speed. A triggering pulse is applied to the base electrode of the transistor 35 to initiate operation of the circuit to actuate the magnetron 10.

Figure 2:
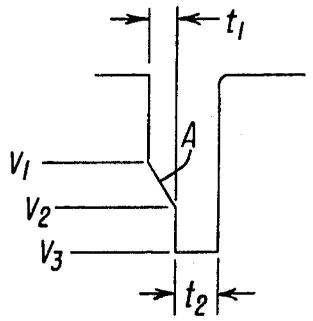
FIG. 2 is a curve illustrating the voltage developed by the circuit of FIG. 1.

Considering now the operation of the circuit, prior to the triggering of the transistor switch 35, capacitors 25 and 26 and the pulse forming network 31 are charged by the potential at point 22. When switch 35 is triggered and point 22 is grounded, capacitors 25 and 26 begin discharging through resistors 23 and 24. The values of capacitor 25 and resistor 23 are such that capacitor 25 will discharge rapidly to provide the voltage $V_1$ (FIG. 2) at point 18 across the primary winding 13 of transformer 12. Capacitor 26 discharges through resistors 23 and 24 in series, with resistor 24 being of a value so that the rise in voltage is relatively slow. This is illustrated by the portion A in FIG. 2. The discharge of capacitor 26 provides the increase in voltage between voltages $V_1$ and $V_2$ in FIG. 2.

When the point 22 is initially grounded, the pulse forming network 31 will discharge slowly through the coil of saturable reactor 30 which has high impedance. As the current through the saturable reactor causes the core thereof to saturate the impedance will reduce. When the core of reactor 30 is saturated, the discharge of the pulse forming network will provide a fast rising pulse indicated by the voltage increase between $V_2$ and $V_3$ in FIG. 2. This pulse starts at a time $t_1$ after the switch 35 has fired, this time being controlled by the characteristics of the saturable reactor 30. The pulse continues for a time $t_2$ controlled by the design of the pulse forming network 31. That is, the voltage pulse produced will continue until the pulse forming network is discharged. As the ground at point 22 will have been removed by this time, the pulse forming network 31 and capacitors 23 and 25 will again charge through the charging circuit 21. This will saturate the core of the saturable reactor in the opposite direction to reset the core.

In order to provide the desired firing of the magnetron tube 10, the components may be selected so that the voltage $V_1$ is approximately 60 to 70 percent of the voltage required to fire the magnetron. The voltage $V_2$, which is a slowly rising voltage, should just reach the firing voltage. This voltage has the characteristics required to cause the magnetron to oscillate in the desired mode. The voltage $V_3$ then provides the power necessary to provide the required output of the magnetron. The firing pulse can be of a short duration as required to provide a short output pulse.

The circuit including capacitors 25 and 26 in effect produces a pedestal for the firing pulse, with the pedestal conditioning the magnetron for operation in the desired mode. The duration of the pedestal is not particularly critical so that the pedestal can have the desired pulse shape. The firing pulse then is applied on the pedestal to cause the magnetron to generate an output pulse of the desired duration. This circuit has been found to be satisfactory to provide magnetron outputs having durations of 100 nanoseconds or less.

As previously stated, the charging circuit 21 must provide sufficient current to reset the core of the saturable reactor 30. It may be desired in certain applications to provide a separate bias winding on the saturable reactor to provide the reset current, but this would result in a decrease circuit efficiency. Typically the charging circuit 21 may be formed by an inductive reactor and isolation diode connected in series between points 20 and 22. The specific characteristics of the charging circuit will depend upon the type of switch device 35 used in the system. The use of a latching type switch such as a thyratron requires that following the triggering pulse, the charging circuit provides sufficient isolation from the power supply to reduce the current flowing through the switch to a value below that required to maintain current flow, for a period at least equal to the recovery time of the switch.

The circuit described has been found to be very effective for modulating a magnetron. The circuit can be constructed from inexpensive components, and is not critical of adjustment. By providing a pedestal for the fast rise firing pulse, the magnetron is conditioned for the desired mode of operation. Then a very short firing pulse will cause the magnetron to oscillate for the desired period.

I claim:

1. A pulse generating circuit including in combination, voltage supply means having a first terminal for providing a charging potential, output means connected between a second terminal and a reference potential, a first circuit including a pulse forming network and a saturable reactor connected in series between said first and second terminals, a second circuit including a first capacitor and a first resistor connected in series between said first and second terminals, said second circuit further including a second capacitor and a second resistor connected in series across said first capacitor, said pulse forming network and said capacitors charging from current applied by said voltage supply means to store energy, and switch means for connecting said first terminal to the reference potential, whereby said first capacitor discharges through said first resistor and said output means to provide a voltage thereacross forming a first pulse portion having a relatively fast rise and said second capacitor discharges through said first and second resistors and said output means to provide a second pulse portion superimposed on said first pulse portion and having a relatively slow rise, said pulse forming network discharging through said saturable reactor and said output means to provide a delayed high power voltage pulse portion superimposed on said first and second pulse portions.

2. A circuit for providing an exciting pulse for a magnetron oscillator including in combination, voltage supply means havng a first terminal for providing a charging potential, output means for applying a pulse to the magnetron oscillator connected between a second terminal and a reference potential, a first circuit including a pulse forming network and a saturable reactor connected in series between said first and second terminals, said first circuit providing current flow from said voltage supply means through said saturable reactor to charge said pulse forming network and store energy therein, a second circuit including capacitor means and resistor means connected between said first and second terminals, said second circuit providing current flow from said voltage supply means through said resistor means to charge said capacitor means, and switch means for connecting said first terminal to the reference potential whereby said capacitor means discharges through said resistor means and said output means to provide a voltage thereacross forming a pulse pedestal, and said pulse forming network discharges through said saturable rector and said output means, said saturable reactor initially presenting high impedance to discharge of said pulse forming network with such impedance decreasing as discharge current flows to provide a delayed high power voltage pulse across said output means superimposed on said pulse pedestal.

3. A circuit for providing an exciting pulse for a magnetron oscillator including in combination, voltage supply means having a first terminal for providing a charging potential, output means for applying a pulse to the magnetron oscillator connected between a second terminal and a reference potential, a first circuit including a pulse forming network and a saturable reactor connected in series between said first and second terminals, said first circuit providing current flow from said voltage supply means through said saturable reactor to charge said pulse forming network and store energy therein, a second circuit including first and second capacitors and resistor means connected between said first and second terminals, said second circuit providing current flow from said voltage supply means through said resistor means to charge said capacitors, and switch means for connecting asid first terminal to the reference potential, whereby asid first capacitor discharges through said resistor means and said output means to provide a voltage thereacross forming a first pulse portion having a relatively fast rise and said second capacitor discharges through said resistor means and said output means to provide a second pulse portion superimposed on said first pulse portion, said second pulse portion having an amplitude to excite the magnetron and a shape to cause operation thereof at the desired mode, said pulse forming network discharging through said saturable reactor and said output means to provide a delayed high power voltage pulse portion superimposed on said first and second pulse portions.

4. A circuit for providing an exciting pulse for a magnetron oscillator including in combination, voltage supply means havng a first terminal for providing a charging potential, output means for applying a pulse to the magnetron oscillator connected between a second terminal and a reference potential, a first circuit including a pulse forming network and a saturable reactor connected in series between said first and second terminals, a second circuit including a first capacitor and a first resistor connected in series between said first and second terminals, said second circuit further including a second capacitor and a second resistor connected in series across said first capacitor, said pulse forming network and said capacitors charging from current applied by said voltage supply means to store energy, and switch means for connecting said first terminal to the reference potential, whereby said first capacitor discharges through first resistor and said output means to provide a voltage across said output means forming a first pulse portion having a relatively fast rise and said second capacitor discharges through said first and second resistors and said output means to provide a second pulse portion across said output means superimposed on said first pulse portion and having a relatively slow rise, said pulse forming network discharging through said saturable reactor and said output means to provide a delayed high power voltage pulse portion superimposed on said first and second pulse portions.

5. A circuit for providing an exciting pulse for a magnetron oscillator including in combination, voltage supply means having a first terminal for providing a charging potential, output means for applying a pulse to the magnetron osicllator connected between a second terminal and a reference potential, a first circuit including a pulse forming network and a saturable reactor connected in series between said first and second terminals, said first circuit providing current flow from said voltage supply means to said saturable reactor to charge said pulse forming network and store energy therein, a second circuit including capacitor means and resistor means connected between said first and second terminals, said second circuit providing current flow from said voltage supply means through said resistor means to charge said capacitor means and switch means for connecting said first terminal to the reference potential whereby said capacitor means discharges through said resistor means and said output means to provide a voltage thereacross forming a pulse pedestal having a value to condition the magnetron for oscillation, and said pulse forming network discharges through said saturable reactor and said output means to provide a high power voltage pulse superimposed on said pulse pedestal, said saturable reactor being constructed to delay said high power pulse for a predetermined interval after operation of said switch means, and said pulse forming network being constructed to provided a high power pulse of a given duration.

References Cited by the Examiner

UNITED STATES PATENTS

| | | | |
|---|---|---|---|
| 2,835,811 | 5/1958 | Bruyning | 331—87 |
| 3,065,363 | 11/1962 | Ribner | 307—88.5 |
| 3,139,534 | 6/1964 | Freeborn | 307—88.5 |
| 3,139,595 | 6/1964 | Barber | 332—12 |
| 3,181,071 | 4/1965 | Smith et al. | 331—87 X |

ROY LAKE, *Primary Examiner.*

J. B. MULLINS, *Assistant Examiner.*